(12) United States Patent
Cahalen et al.

(10) Patent No.: US 6,174,647 B1
(45) Date of Patent: Jan. 16, 2001

(54) METALLIZATION PROCESS AND COMPONENT

(75) Inventors: John P. Cahalen, Arlington; Wade Sonnenberg, Upton, both of MA (US)

(73) Assignee: Shipley Company, L.L.C., Marlborough, MA (US)

( * ) Notice: Under 35 U.S.C. 154(b), the term of this patent shall be extended for 0 days.

(21) Appl. No.: 09/013,364

(22) Filed: Jan. 26, 1998

(51) Int. Cl.[7] ............................................. G03F 7/26
(52) U.S. Cl. ........................... 430/315; 430/313; 427/98
(58) Field of Search ................................... 430/312, 313, 430/315; 427/98, 125

(56) References Cited

U.S. PATENT DOCUMENTS

| | | | |
|---|---|---|---|
| 4,902,610 | 2/1990 | Shipley | 430/312 |
| 4,986,848 * | 1/1991 | Yamamoto et al. | 106/1.11 |
| 5,246,817 | 9/1993 | Shipely, Jr. | 430/312 |
| 5,334,488 | 8/1994 | Shipley, Jr. | 430/315 |
| 5,354,593 * | 10/1994 | Grandmont et al. | 428/137 |
| 5,389,496 | 2/1995 | Calvert et al. | 430/315 |
| 5,468,597 * | 11/1995 | Calabrese et al. | 430/315 |
| 5,500,315 | 3/1996 | Calvert et al. | 430/16 |
| 5,837,427 * | 11/1998 | Hwang et al. | 430/312 |

* cited by examiner

*Primary Examiner*—Kathleen Duda
(74) *Attorney, Agent, or Firm*—Peter F. Corless; Darryl P. Frickey; Edwards & Angell, LLP

(57) ABSTRACT

This invention is directed to a process for the selective metallization which utilizes multiple photoresist layers, using a buried palladium ligand which is then catalyzed using a PdBr selective catalyst. The Pd in the catalyst is then reduced to $Pd^0$ and metallized using for example electroless copper.

12 Claims, 1 Drawing Sheet

METALLIZATION PROCESS AND COMPONENT

This invention relates to the selective metallization of surfaces which have been treated so as to be particularly receptive to electroless deposition of metal. This process utilizes a technique of burying some of the treated surfaces with a photoresist in order to prevent channeling (shorting) between different conductive portions of a circuit. The process herein is particularly suited for the sequential build of circuit layers of e.g. electronic circuit boards.

Selective metallization procedures for electronic manufacture are known in the art. A process for plasma etching a substrate is disclosed in U.S. Pat. No. 5,053,318 incorporated herein by reference. In accordance with the processes of this patent, a suitable substrate, such as an electronic base material of this patent, is coated with a radiation-sensitive photoresist composition. The photoresist coating is then pattern imaged. Thereafter, and before development, the surface of the photoresist is contacted with an electroless plating catalyst. The photoresist coating is then contacted with a developer whereby plating catalyst adsorbed onto developer soluble portions of the coating is removed with solubilized photoresist. Plating catalyst remains on those portions of the coating that are insoluble in developer. This results in formation of a catalytic coating in an image pattern that conforms to the developed photoresist coating. The imaged catalytic coating is then metallized by contact with an electroless plating solution to form a thin metallic layer. The entire article is then subjected to plasma etching. The thin metallic layer functions as an etch barrier whereby the substrate is altered in a reverse image of the metallic layer. The remaining photoresist coating with the metallic layer may then be removed by contact with a photoresist stripper.

A selective metallization process for manufacture of printed circuit boards is disclosed in U.S. Pat. No. 5,158,860, incorporated herein by reference. In the process of this patent, a substrate is coated with a photoresist layer. The photoresist is then pattern imaged and developed to form a relief image. The article is then contacted with an electroless plating catalyst. The catalyst is adsorbed onto all surfaces with which it comes into contact, i.e., the side-walls of the photoresist and the underlying substrate. The top surface of the photoresist is then flood exposed. The catalytic layer adsorbed on the top surface of the photoresist coating is then removed by surface development. Catalyst remains in surfaces not exposed to activating radiation, i.e., the recesses within the photoresist relief image and on the bared substrate surface. Electroless metal may then be deposited over catalyzed surfaces whereby the walls of the relief image and the substrate become metallized. With continued plating, the entire volume of the recesses may be filled with deposited metal.

Another approach to selective metallization is described in U.S. Pat. No. 5,079,600, incorporated herein by reference. In accordance with this patent, metal pathways are formed on the surface of a substrate by a process that comprises formation of a self-assembled monomolecular radiation reactive layer. Preferred materials are characterized by a polar end, a non-polar opposite end with a reactive moiety at or near its terminus, and an intermediate region typically composed of saturated or unsaturated hydrocarbon chains. Organosilanes are a preferred class of materials. Thereafter, the reactivity of the terminus reactive groups on the film are altered in a selective pattern by exposure to imaged radiation to cause photolytic cleavage or transformation of the reactive terminus groups. Since irradiation is in a pattern, the reactivity of the monomolecular layer is altered in corresponding image pattern. In one embodiment, differential reactivity comprises creation of hydrophobic-hydrophilic regions in the pattern. The surface is then contacted with an electroless plating catalyst. Since the catalyst is an aqueous based material, it will selectively absorb on the hydrophilic portions of the monomolecular layer. The substrate may then be metal plated by contact with an electroless plating solution with metal depositing only over catalytic sites in the desired image pattern.

An improvement to the procedures of U.S. Pat. No. 5,077,085 is disclosed in published European Patent Application publication No. 0,510,711, incorporated herein by reference. In accordance with preferred procedures of this application, a process for selective metallization comprises the steps of formation of a layer over a substrate having a terminus group capable of bonding with a catalyst precursor. Preferably, the terminus group is a metal ion binding or ligating group, and the layer is a self-assembled film having a terminus ligating group. Following formation of the ligating layer and imaging of the same using procedures analogous to the procedures of the above-cited U.S. Pat. No. 5,079,600, the surface contains regions having reactive ligand groups in a desired image pattern. This layer is then contacted with a catalyst precursor solution such as a solution of palladium ions. The ions bond with the ligating groups of the ligating layer. Subsequent contact of the layer with an electroless plating catalyst containing a suitable reducing agent results in selective electroless metal deposition of metal onto the ligating layer in the desired pattern.

Another selective metallization process is disclosed in U.S. Pat. No. 5,468,597. In this patent, there is disclosed the steps of formation of a ligating layer over a substrate such as an electronic base material, coating the layer with an organic coating, especially a photoresist compositions, imaging the photoresist layer to provide a relief image, i.e., one having recesses therein open to the substrate, thus baring the ligating layer over the bared substrate, contact of the substrate with a catalytic precursor to bond the precursor to the exposed ligating groups to form a catalytic surface in a desired image pattern and metal deposition to form a metal layer in a desired pattern.

The catalytic precursor used is one that bonds with the ligating groups of the ligating layer typically by coordination bonding, but will not otherwise adsorb onto the surfaces of the article. This enables selective metallization because the metal depositing solution contacts catalytic material only in a desired image pattern. Following selective metallization, the metallized article can be completed such as by etching using the metal coating as an etch mask or continuing metal deposition to form a thick deposit.

U.S. Pat. No. 4,515,829 discloses a process for the electroless plating of through holes in a printed circuit board.

SUMMARY OF THE INVENTION

This invention provides a novel process for selective deposition of relatively thick metal pads and traces in the sequential build of circuit layers of a circuit board.

The process of this invention comprises the steps of applying a photoresist, e.g., a negative acting photoresist to an initial circuit layer on a substrate and imaging a via. The photoresist is then roughened, e.g., using a permanganate system. Thereafter a palladium ligand material comprising a polyquaternary amine is absorbed on the photoresist and the side walls of the photoresist defining the via.

A photoresist is then applied over the ligand layer and into the via. Thereafter, the photoresist is imaged for formation of conductive pads and traces.

The exposed ligand layer, i.e., the non photoresist buried ligand layer, is then catalyzed using a palladium halide selective catalyst (the palladium halide preferably being a palladium bromide). Thereafter, the palladium halide catalyst is reduced from $Pd^{++}$ to $Pd^0$. At this time, the pads and traces are formed using electroless metal bath, e.g., a copper bath.

This process is an improvement over the art in that strongly adhering metallized surfaces are formed. In addition, the method used provides an improved method of preventing channeling (shorting) between conductive portions of the circuit board. Another improvement on current technology is the ability to build the via metal and trace/pad metal at the same time.

As used herein, imaging includes the utilization of a pattern (mask), and light energy to expose areas of the photoresist and then the developing of same to remove areas of the photoresist as is conventional in the art.

DETAILED DESCRIPTION OF THE DISCLOSURE

Figure 1:
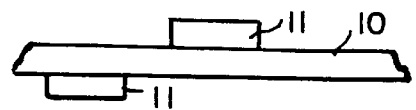
FIGS. 1 to 6 illustrate a sequence of steps for selective metal deposition.
Figure 2:
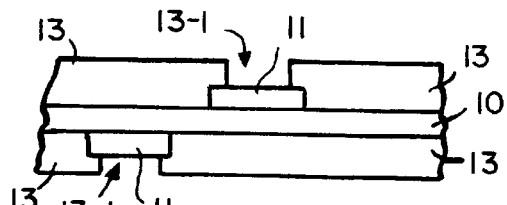
Figure 3:
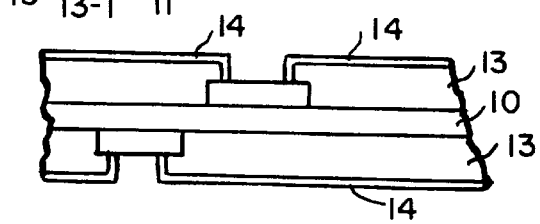
Figure 4:
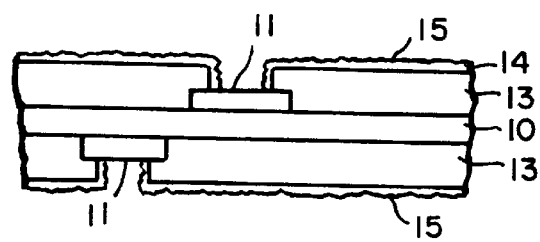
Figure 5:
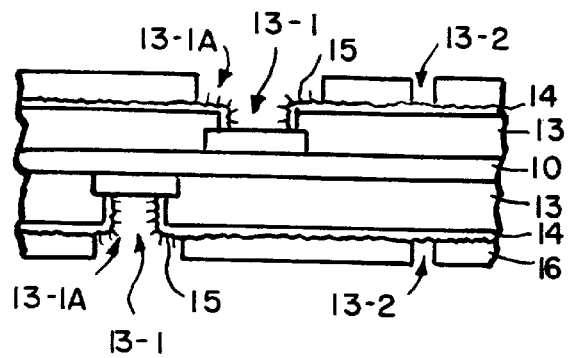

Referring now to the figures, the method steps performed in this invention are preferably as follows:

An initial circuit layer comprising a dielectric substrate 10 and metal lands 11 is shown in FIG. 1. FIG. 2 illustrates the layer of photoresist 13 in which vias 13-1 have been provided. The photoresist is preferably a negative photoresist which has been imaged and developed to form the vias 13-1. Thereafter, the layer 13 is roughened on top and in the side walls defining the vias using a conventional, e.g., permanganate swell and etch and neutralizer to form the surface 14 in FIG. 3. Also, other ways of roughening the surface include the following: chromic acid etch and plasma etch. At this time, to the roughened areas on the top and in the side walls of the layer 13 defining the vias, there is adsorbed a palladium ligand shown at 15 in FIG. 4. In FIG. 5, there is illustrated the application of a second layer of preferably a negative photoresist 16 which is imaged and developed to leave an area for deposition of metal pads and buries the remainder of the ligand 15.

Figure 6:
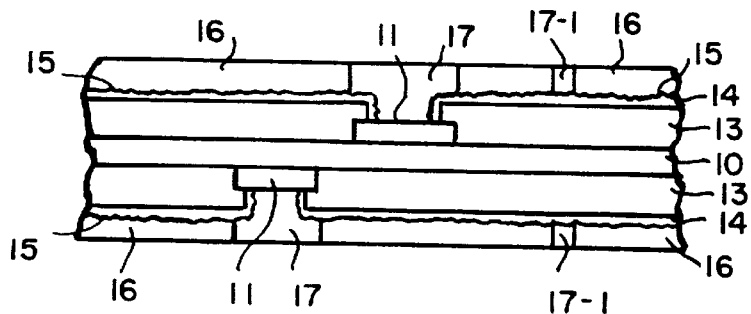

The exposed surface 15 of FIG. 5 is then catalyzed using a selective catalyst e.g., PdBr selective catalyst which is then reduced from $Pd^{++}$ to $Pd^0$. Thereafter, the pad 17 (FIG. 6) is formed using electroless metal deposition, e.g. copper metal deposition on the exposed $Pd^0$ surface.

Other metals such as nickel, gold, silver and aluminum may also be used in place of copper.

It should be understood that the substrate used may be selected from a host of different materials, e.g., epoxy, fiberglass and others well-known in the art as long as the substrate acts as a dielectric.

The photoresists likewise may be selected from a wide number of photoresists and both positive as well as negative photoresists may be used although negative resists are preferred because in the embodiment shown, the photoresist acts as a permanent layer.

The palladium ligand used in this invention utilizes a polyquaternary amine. As the palladium catalyst, PdBr is preferred, however, PdCl or PdI may also be conveniently used to deposit palladium on the ligand. Various reducing agents may also be used to effect conversion of $Pd^{++}$ to $Pd^0$ e.g., dimethyl amino borane, sodium borohydride or sodium hypophosphite may conveniently be used.

EXAMPLE 1

Starting with an initial circuit layer, as shown in the figures which comprises an epoxy substrate 10 having copper patterned areas (lands) 11 thereon. A negative photoresist Shipley XP-9500 CC-1 is applied as a 2.0 ml. thick layer and imaged using activating light energy and a mask and then conventionally developed to leave exposed vias 13-1 (See FIG. 2).

Thereafter, the remaining photoresist is roughened using a permanganate swell and plasma etch and is then neutralized with Shipley CIRCUPOSIT Neutralizer 3314 to form the surface 14.

A palladium ligand is then applied using a Shipley conditioner 3320 containing a polyquaternary amine ligand to the roughened surface to form the layer 15. A second layer (1 ml. thick) of a negative photoresist, Shipley XP-9500 CC-1, is then applied and imaged as before exposing the area for the via as well as a small portion of the neutralized and roughened surface of the first photoresist (See FIG. 5). Thus a large portion of the applied ligand is buried in the method herein.

The exposed roughened and neutralized photoresist is then catalyzed with a palladium bromide catalyst and reduced to $Pd^0$ with a reducing agent, e.g., dimethyl amino borane.

Thereafter, electroless copper bath, e.g., Shipley #3350 is used to form the copper pads 17.

EXAMPLE 2

The method of Example 1 was repeated except that Shipley Conditioner #219 also containing the polyquaternary amine liquid was used in place of the Conditioner #3320.

EXAMPLE 3

The method of Example 1 was followed except that traces were also formed in layer 16 using conventional imaging and developing to expose the ligand 15 and define a trace outline 13-2 (FIG. 5). The exposed ligand 15 is catalyzed and the palladium $Pd^{++}$ is reduced to palladium $Pd^0$. Metal traces of copper were then formed by metallization with electroless copper at the same time as the metal pads 17 also of copper were formed (see FIG. 6).

What is claimed is:
1. A process for the building of a circuit which comprises
    (a) providing a circuit layer having a layer of photoresist and via opening defined by said photoresist;
    (b) roughening the photoresist;
    (c) adsorbing a compound having a ligand for palladium on said photoresist including the photoresist walls defining the via opening;
    (d) applying a photoresist over said compound and forming a pad opening therein to expose a portion of the underlying compound;
    (e) catalyzing the exposed compound with palladium to form a palladium catalyst compound and reducing the catalyst compound to $Pd^0$; and
    (f) metallizing the exposed palladium catalyst compound to form a metal pad.
2. The process of claim 1 in which the metal is copper.
3. The process of claim 1 in which the metallizing step is performed using an electroless copper bath.

4. The process of claim 1 in which the palladium catalyst compound comprises a palladium halide.

5. The process of claim 4 in which the palladium halide is palladium bromide.

6. The process of claims 1, 2, 3, 4 or 5 in which the compound having a ligand for palladium is a polyquaternary amine.

7. A process for the building of a circuit which comprises
   (a) providing a circuit layer having a layer of photoresist and via opening defined by said photoresist;
   (b) roughening the photoresist;
   (c) adsorbing a compound having a ligand for palladium on said photoresist including the photoresist walls defining the via opening;
   (d) applying a photoresist over said compound and forming a trace opening and a pad opening therein to expose a portion of the underlying;
   (e) catalyzing the exposed with palladium to form a palladium catalyst compound and reducing the catalyst compound to $Pd^0$; and
   (f) metallizing the exposed palladium catalyst compound to form a metal trace in the trace opening and a metal pad in the pad opening.

8. The process of claim 7 in which the metal is copper.

9. The process of claim 7 in which the metallizing step is performed using an electroless copper bath.

10. The process of claim 7 in which the palladium catalyst compound is a palladium halide.

11. The process of claim 10 in which the palladium halide is palladium bromide.

12. The process of claims 7, 8, 9, 10 or 11 in which the is a compound having a ligand for palladium is a polyquaternary amine.

* * * * *